(12) United States Patent
Lu et al.

(10) Patent No.: US 12,426,454 B2
(45) Date of Patent: Sep. 23, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hongting Lu, Beijing (CN); Baolei Huo, Beijing (CN); Kuo Sun, Beijing (CN); Yuhsiung Feng, Beijing (CN); Linqian Han, Beijing (CN); Yangpeng Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 635 days.

(21) Appl. No.: 17/779,279

(22) PCT Filed: May 27, 2021

(86) PCT No.: PCT/CN2021/096394
§ 371 (c)(1),
(2) Date: May 24, 2022

(87) PCT Pub. No.: WO2022/246739
PCT Pub. Date: Dec. 1, 2022

(65) Prior Publication Data
US 2022/0416198 A1 Dec. 29, 2022

(51) Int. Cl.
*H10K 59/129* (2023.01)
*H10K 50/824* (2023.01)
(Continued)

(52) U.S. Cl.
CPC ......... *H10K 59/129* (2023.02); *H10K 50/824* (2023.02); *H10K 50/828* (2023.02);
(Continued)

(58) Field of Classification Search
CPC .. H10K 50/824; H10K 50/828; H10K 59/131; H10K 59/352; H10K 59/353; H10K 59/80524; H10K 59/80522; H10K 59/129
See application file for complete search history.

(56) References Cited

U.S. PATENT DOCUMENTS

| 2014/0264315 A1 | 9/2014 | Ono et al. |
| 2017/0141164 A1 | 5/2017 | Xiong et al. |

(Continued)

FOREIGN PATENT DOCUMENTS

| CN | 103907397 A | 7/2014 |
| CN | 104134429 A | 11/2014 |

(Continued)

*Primary Examiner* — Teresa M. Arroyo
(74) *Attorney, Agent, or Firm* — IPro, PLLC

(57) ABSTRACT

The present disclosure provides a display substrate and a display device. The display substrate includes: a driver chip, a display area and a peripheral area surrounding the display area, the driver chip is located in the peripheral area, the driver chip is close to a first side of the display area; the display substrate further includes: a cathode layer extending from the display area to the peripheral area; a cathode auxiliary layer extending from the display area to the peripheral area, and the cathode auxiliary layer is coupled to the cathode layer in the display area; a power line layer located in the peripheral area, the power line layer includes a first power line pattern, and the first power line pattern is close to the first side of the display area; the first power line pattern is coupled to the cathode auxiliary layer.

19 Claims, 11 Drawing Sheets

(51) Int. Cl.
  *H10K 50/828* (2023.01)
  *H10K 59/131* (2023.01)
  *H10K 59/80* (2023.01)

(52) U.S. Cl.
  CPC ..... *H10K 59/131* (2023.02); *H10K 59/80522* (2023.02); *H10K 59/80524* (2023.02)

(56) References Cited

U.S. PATENT DOCUMENTS

| | | |
|---|---|---|
| 2018/0040684 A1 | 2/2018 | Matsueda et al. |
| 2018/0348918 A1 | 12/2018 | Rhe et al. |
| 2019/0148653 A1* | 5/2019 | Chen ...................... H10K 71/00 345/173 |
| 2020/0176541 A1 | 6/2020 | Xu et al. |
| 2020/0235329 A1* | 7/2020 | Tian ................ H10K 59/80522 |
| 2021/0210571 A1 | 7/2021 | Zhang |
| 2021/0320166 A1* | 10/2021 | Zhao ................... H10K 59/352 |
| 2022/0037615 A1 | 2/2022 | Xu et al. |
| 2022/0115473 A1* | 4/2022 | Han ..................... H10K 59/873 |
| 2022/0115483 A1* | 4/2022 | Li .......................... H10K 71/00 |

FOREIGN PATENT DOCUMENTS

| | | |
|---|---|---|
| CN | 107689209 A | 2/2018 |
| CN | 109585491 A | 4/2019 |
| CN | 110349993 A | 10/2019 |
| CN | 110556406 A | 12/2019 |
| CN | 110739338 A | 1/2020 |
| CN | 112331703 A | 2/2021 |
| JP | 2019200804 A | 11/2019 |
| KR | 20070118889 A | 12/2007 |
| WO | WO-2013069041 A1 * | 5/2013 ......... H01L 27/3246 |

\* cited by examiner

DISPLAY SUBSTRATE AND DISPLAY DEVICE

CROSS-REFERENCE TO RELATED APPLICATION

The present application is the U.S. national phase of PCT Application No. PCT/CN2021/096394 filed on May 27, 2021, which is incorporated herein by reference in its entirety.

TECHNICAL FIELD

The present disclosure relates to the field of display technology, and more particularly to a display substrate and a display device.

BACKGROUND

Organic Light-Emitting Diode (OLED) display products are widely used in various fields due to their advantages of high brightness, low power consumption, fast response, high definition, good flexibility and high light emitting efficiency.

The OLED display product includes a negative power line located in a peripheral area, the negative power line is arranged around the display area of the OLED display product, and is used to provide a negative power signal for a cathode layer included in the display product.

SUMMARY

The objective of the present disclosure is to provide a display panel and a display device.

In order to achieve the above objective, the following technical solutions are provided by the present disclosure.

In a first aspect, a display substrate includes: a driver chip, a display area and a peripheral area surrounding the display area, wherein the driver chip is located in the peripheral area, the driver chip is close to a first side of the display area; the display substrate further includes: a cathode layer, wherein the cathode layer extends from the display area to the peripheral area; a cathode auxiliary layer, wherein the cathode auxiliary layer extends from the display area to the peripheral area, and the cathode auxiliary layer is coupled to the cathode layer in the display area; a power line layer, wherein the power line layer is located in the peripheral area, the power line layer includes a first power line pattern, and the first power line pattern is close to the first side of the display area; the first power line pattern is coupled to the cathode auxiliary layer.

Optionally, the cathode auxiliary layer includes a first auxiliary portion, and at least part of the first auxiliary portion is located in the display area, and the first auxiliary portion is of a grid structure, the first auxiliary portion is coupled to the cathode layer in the display area.

Optionally, the display substrate further comprises a bridging layer, and the bridging layer is arranged at different layers from each of the cathode auxiliary layer and the power line layer; the first auxiliary portion is coupled to the first power line pattern through the bridging layer.

Optionally, the cathode auxiliary layer further includes a second auxiliary portion located in the peripheral area, and the second auxiliary portion is close to the first side of the display area, the second auxiliary portion is coupled to the first power line pattern.

Optionally, the display substrate further includes: a connection layer, wherein the connection layer is located between the cathode auxiliary layer and the cathode layer, and the connection layer includes a plurality of first connection patterns located in the display area, the first auxiliary portion is coupled to the cathode layer through the plurality of first connection patterns in the display area.

Optionally, the display substrate further includes: a plurality of pixel units arranged in an array, the pixel unit includes an anode pattern group, and an orthographic projection of the first connection pattern on a substrate of the display substrate is located at a periphery of an orthographic projection of the anode pattern group on the substrate.

Optionally, the connection layer further includes: a second connection pattern located in the peripheral area, wherein the second connection pattern is close to the first side of the display area, the second auxiliary portion is coupled to the cathode layer through the second connection pattern.

Optionally, the power line layer further includes a second power line pattern, the second power line pattern is close to a second side of the display area, the first side and the second side are opposite; the first auxiliary portion is coupled to the second power line pattern through the bridging layer; the cathode auxiliary layer further includes a third auxiliary portion located in the peripheral area, the third auxiliary portion is close to the second side of the display area; the third auxiliary portion is coupled to the second power line pattern.

Optionally, the connection layer further includes: a third connection pattern located in the peripheral area, wherein the third connection pattern is close to the second side of the display area, and the third auxiliary portion is coupled to the cathode layer through the third connection pattern.

Optionally, each of the second connection pattern and the third connection pattern includes a plurality of first connection sub-patterns and a plurality of second connection sub-patterns; the plurality of first connection sub-patterns are arranged in an array, and adjacent first connection sub-patterns are coupled to each other through the second connection sub-pattern.

Optionally, each of the second auxiliary portion and the third auxiliary portion includes a plurality of first auxiliary sub-patterns and a plurality of second auxiliary sub-patterns, the plurality of first auxiliary sub-patterns are arranged in an array, and adjacent first auxiliary sub-patterns are coupled to each other through the second auxiliary sub-pattern.

Optionally, the first power line pattern includes a first sub-pattern and two second sub-patterns; the first sub-pattern is located between the two second sub-patterns and the display area, the first sub-pattern includes a portion extending along the first direction, the second sub-pattern includes a portion extending along the second direction, and the first direction intersects the second direction; the first sub-pattern is coupled to the second auxiliary portion; the two second sub-patterns are coupled to two ends of the first sub-pattern respectively, and the two second sub-patterns are also respectively coupled to the driver chip; each of the first sub-pattern and the second power line pattern includes: a plurality of first power sub-patterns and a plurality of second power sub-patterns, and the plurality of first power sub-patterns are arranged in an array, adjacent first power sub-patterns are coupled to each other through the second power sub-pattern.

Optionally, an orthographic projection of at least part of the first connection sub-pattern on the substrate of the display substrate coincides with an orthographic projection of at least part of the first auxiliary sub-pattern on the substrate, and coincides with an orthographic projection of at least part of the first power sub-pattern on the substrate; and/or, an orthographic projection of at least part of the second connection sub-pattern on the substrate coincides with an orthographic projection of at least part of the second auxiliary sub-pattern on the substrate, and coincides with an orthographic projection of at least part of the second power sub-pattern on the substrate.

Optionally, the display substrate further includes a first source-drain metal layer, a second source-drain metal layer, and an anode layer that are sequentially stacked along a direction away from the substrate of the display substrate; the power line layer and the first source-drain metal layer are arranged at the same layer and made of the same material, the cathode auxiliary layer and the second source-drain metal layer are arranged at the same layer and made of the same material, and the connection layer and the anode layer are arranged at the same layer and made of the same material.

Optionally, the cathode layer includes a plurality of first cathode patterns and a plurality of second cathode patterns; the plurality of first cathode patterns are arranged in an array, adjacent first cathode patterns are coupled to each other through the second cathode pattern.

Optionally, the display area includes a first display region and a second display region, and a camera component is arranged at the second display region; the cathode layer includes a first cathode portion and a second cathode portion, the first cathode portion extends from the first display region to the peripheral area, and the second cathode portion is located in the second display region; the second cathode portion includes a plurality of third cathode patterns; the display substrate further includes a plurality of laser blocking patterns, an orthographic projection of the plurality of laser blocking patterns on the substrate of the display substrate coincides with an orthographic projection of the plurality of third cathode patterns on the substrate.

Optionally, the display substrate further includes a driving transistor in the first display region; the laser blocking pattern and an active layer of the driving transistor are arranged at the same layer and made of the same material.

Optionally, the display substrate further includes a transparent conductive connection layer, and the transparent conductive connection layer is respectively coupled to the plurality of third cathode patterns.

Optionally, the transparent conductive connection layer extends from the second display region to the peripheral area, and the transparent conductive connection layer is coupled to the second power line pattern included in the power line layer.

Optionally, the transparent conductive connection layer is of a grid structure.

Optionally, the cathode auxiliary layer includes a fourth auxiliary portion, the fourth auxiliary portion is located in the second display region, and the fourth auxiliary portion includes a plurality of third auxiliary sub-patterns, the plurality of third auxiliary sub-patterns are located between the transparent conductive connection layer and the third cathode pattern, the transparent conductive connection layer is coupled to a corresponding third cathode pattern through a corresponding third auxiliary sub-pattern.

Optionally, a notch is located on a side surface of the third auxiliary sub-pattern; the display substrate further includes an anode layer, a light-emitting functional layer and a common layer; the light-emitting functional layer and the common layer are located between the anode layer and the cathode layer, and the light-emitting functional layer and the common layer are stacked; the common layer is disconnected at the notch of the third auxiliary sub-pattern.

Optionally, the display substrate further includes: a first initialization signal line located in the peripheral area, the first initialization signal line being close to the first side of the display area; a second initialization signal line located in the peripheral area, the second initialization signal line being close to the second side of the display area, and the second side being opposite to the first side; an initialization signal layer extending from the display area to the peripheral area, the initialization signal layer being respectively coupled to the first initialization signal line and the second initialization signal line.

In a second aspect, a display device includes the display substrate.

BRIEF DESCRIPTION OF THE DRAWINGS

The drawings described here are used to provide a further understanding of the present disclosure and constitute a portion of the present disclosure. The exemplary embodiments and descriptions of the present disclosure are used to explain the present disclosure, and do not constitute an improper limitation of the present disclosure.

DETAILED DESCRIPTION

In order to further explain the array panel and the manufacturing method thereof and the display device provided by the embodiments of the present disclosure, a detailed description will be given below in conjunction with the accompanying drawings of the disclosure.

In the related art, the negative power line in the OLED display product is arranged around the display area of the display product, and is generally formed in a double hollow structure or a structure of a door shape. The width of each frame of the display product is increased by the negative power line of such structure, which is not conducive to the narrow frame of the display product.

Figure 1:
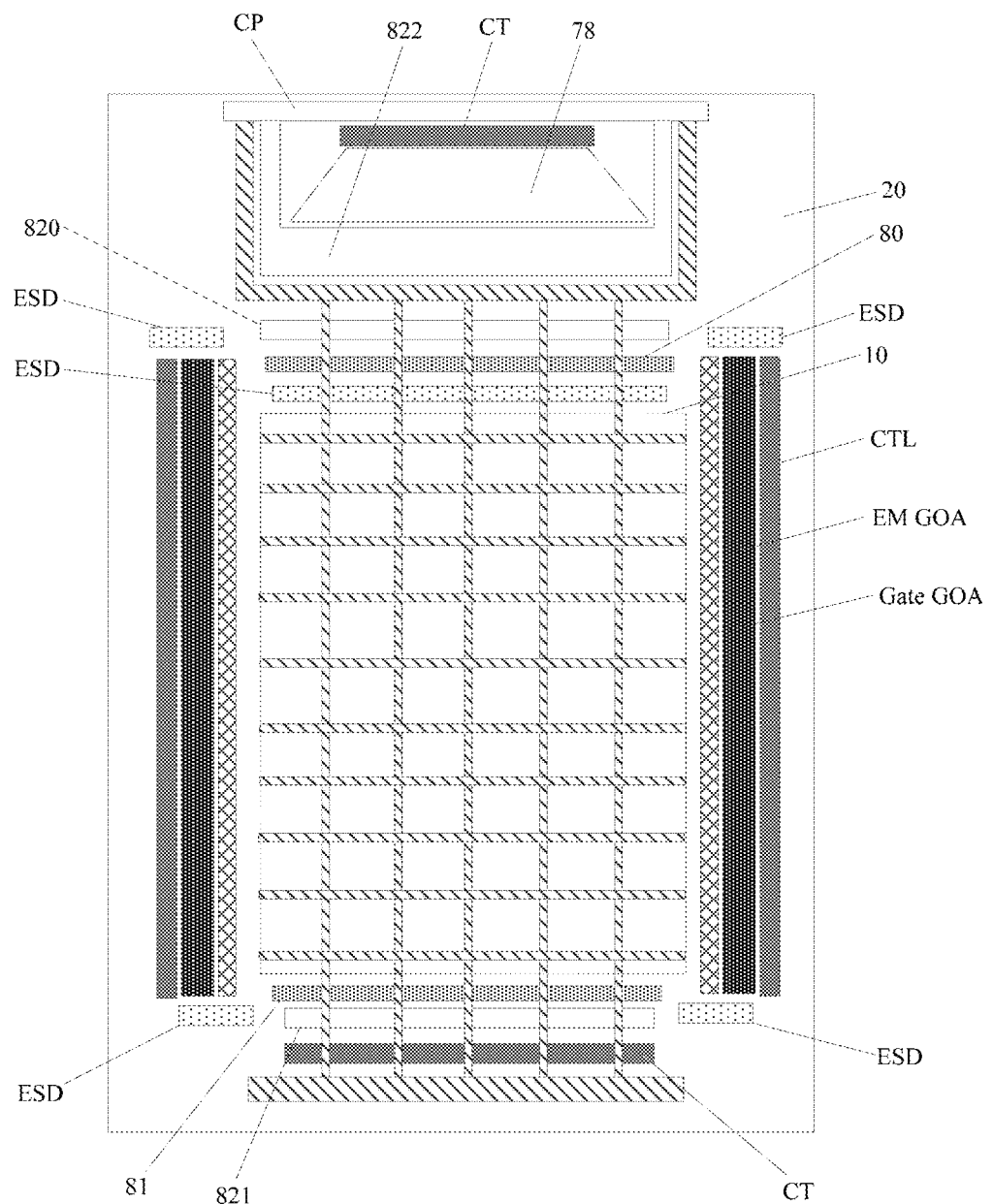
FIG. 1 is a schematic structural diagram of a display substrate provided by an embodiment of the present disclosure.
Figure 2:
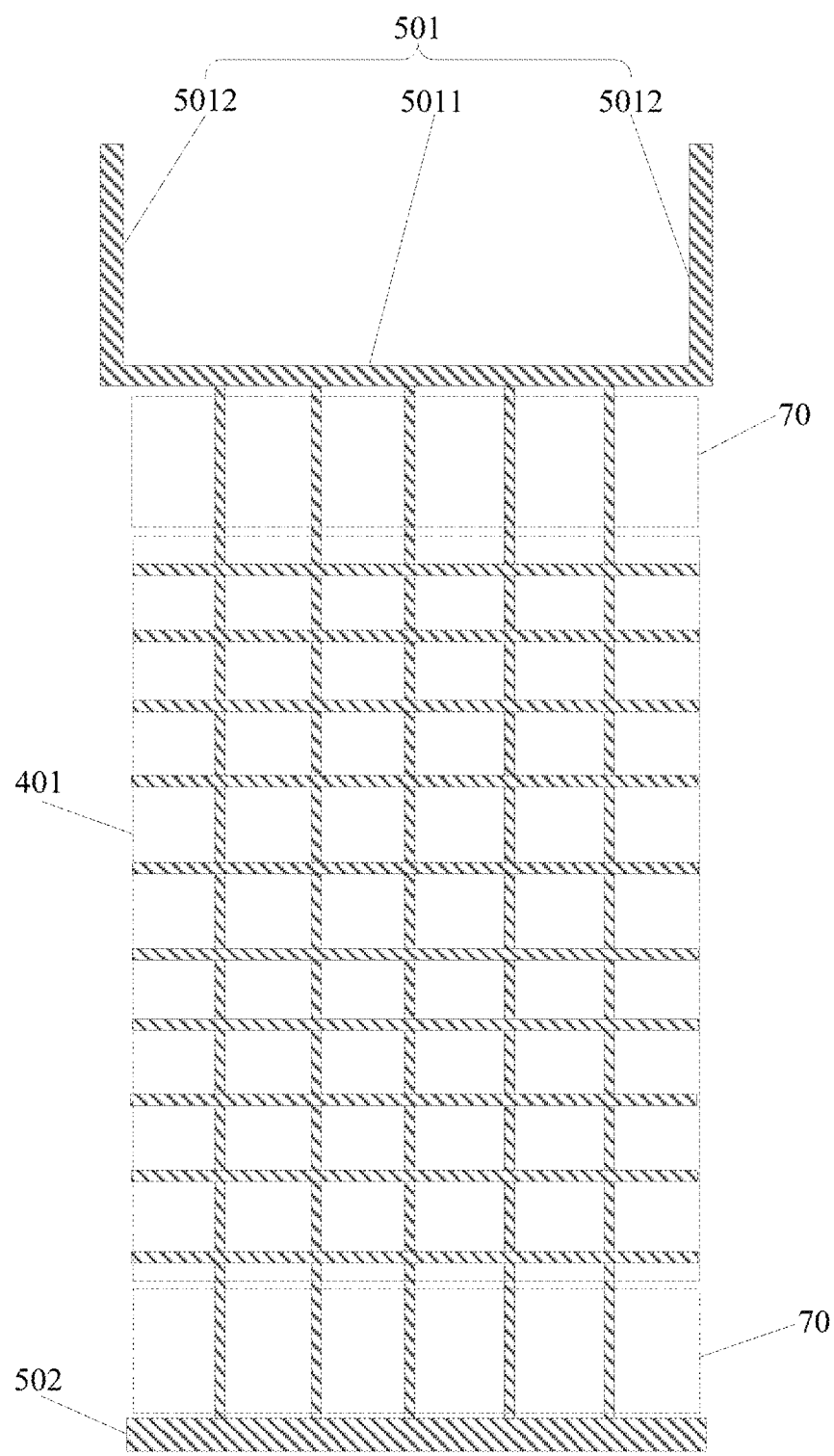
FIG. 2 is a schematic diagram of a first auxiliary portion and a power line layer according to an embodiment of the present disclosure.
Figure 3:
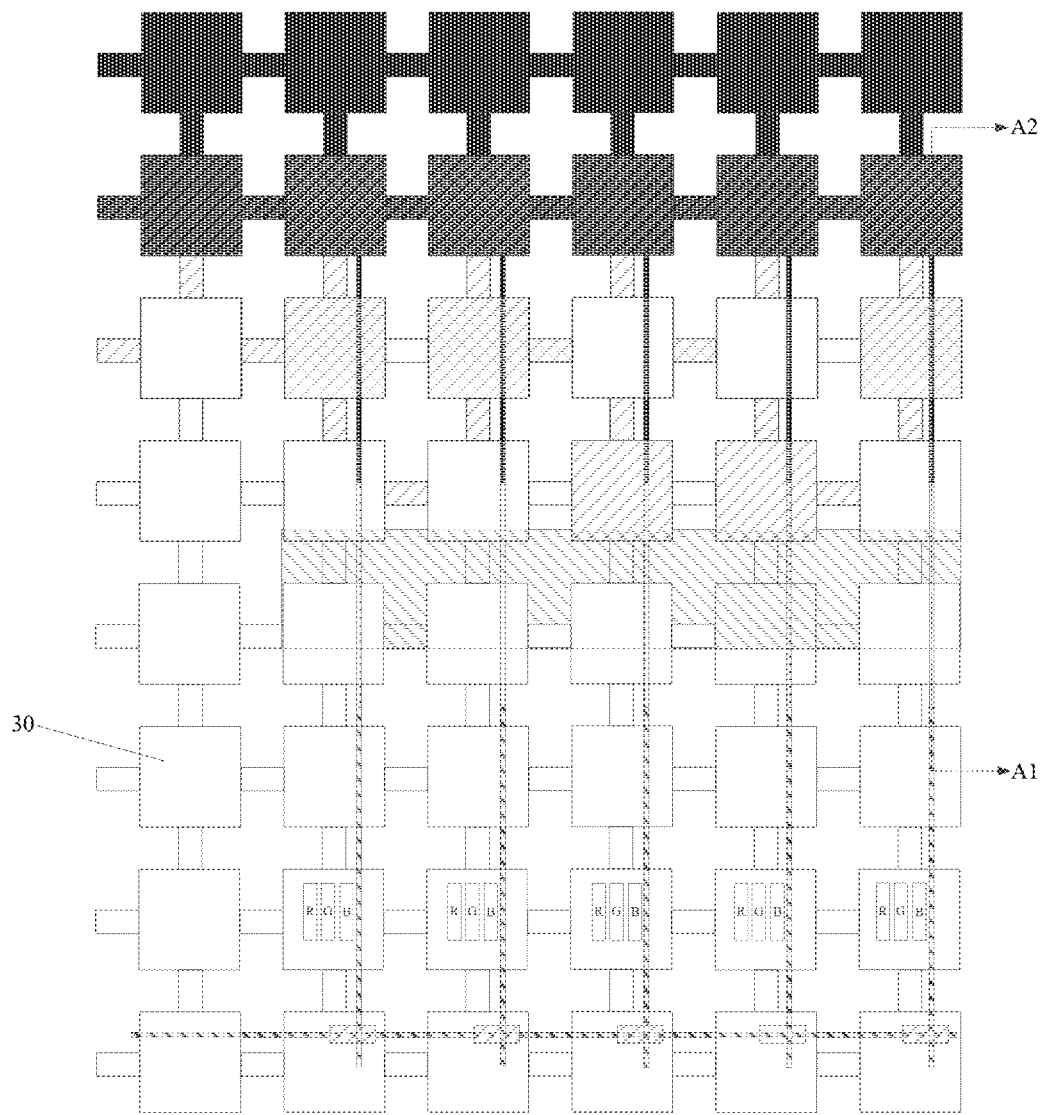
FIG. 3 is a schematic diagram of a first power line pattern from a first side of a display area to a peripheral area according to an embodiment of the present disclosure.

Referring to FIG. 1 to FIG. 5, a display substrate provided by an embodiment of the present disclosure includes: a driver chip, a display area 10 and a peripheral area 20 surrounding the display area 10, the driver chip is located in the peripheral area, the driving chip is close to a first side of the display area; the display substrate further includes:

As shown in FIG. 1 and FIG. 3, a cathode layer 30, the cathode layer 30 extends from the display area 10 to the peripheral area 20;

As shown in FIG. 1 and FIG. 2, a cathode auxiliary layer (e.g., the first auxiliary portion 401), the cathode auxiliary layer extends from the display area 10 to the peripheral area 20, and in the display area 10, the cathode auxiliary layer is coupled to the cathode layer 30;

As shown in FIG. 2, a power line layer, the power line layer is located in the peripheral area 20, the power line layer includes a first power line pattern 501, and the first power line pattern 501 is close to the first side of the display area 10; the first power line pattern 501 is coupled to the cathode auxiliary layer.

Exemplarily, the display area 10 includes a rectangle; the peripheral area 20 surrounds the display area 10, and the peripheral area 20 forms an upper frame and a lower frame oppositely arranged in the display substrate, and a left frame and a right frame arranged oppositely.

Exemplarily, the left frame and the right frame include a gate driving circuit (Gate GOA), a light emitting control driving circuit (EM GOA), and a test signal line CTL. The upper frame includes a test circuit CT, a fan-out area 78, a positive power line, a chip-on-film pad CP (COF PAD) and a test pad (Cell Test PAD). Exemplarily, an electrostatic protection circuit ESD is arranged at the periphery of the display area 10.

Exemplarily, the cathode layer 30 is made of a metal material, and the cathode layer 30 is formed as an integral structure, including a part located in the display area 10 and a part located in the peripheral area 20.

Exemplarily, the cathode auxiliary layer 30 includes a part located in the display area 10 and a part located in the peripheral area 20, and in the display area 10, the cathode auxiliary layer is coupled to the cathode layer 30 at a plurality of positions.

Exemplarily, the power line layer includes a negative power line layer, and the power line layer is used to transmit a negative power signal.

Exemplarily, the power line layer includes a first power line pattern 501, the first power line pattern 501 is located on the upper frame of the display substrate, and the first power line pattern 501 is close to the first side of the display area 10.

Exemplarily, the power line layer is not located on the left frame or the right frame of the display substrate. The left frame is close to a third side of the display area 10, the right frame is close to a fourth side of the display area 10, and both the third side and the fourth side are adjacent to the first side.

According to the specific structure of the above-mentioned display substrate, in the display substrate provided by the embodiment of the present disclosure, the cathode auxiliary layer extends from the display area 10 to the peripheral area 20, and the cathode auxiliary layer can be coupled to the cathode layer 30 in the display area 10, and coupled to the first power line pattern 501 in the peripheral area 20, so as to realize the coupling between the cathode layer 30 and the first power line pattern 501. In the display substrate provided by the embodiment of the present disclosure, the power line layer may be located only on the first side of the peripheral region 20 close to the first side (e.g. the upper side) of the display area 10, that is, the power line layer is not located on other sides (such as the left and right sides) of the peripheral region 20 close to the display area 10, which effectively reduces the width of the frames of the display substrate close to the other sides of the display area 10, which is beneficial to the development of the narrow frame of the display substrate. Moreover, in the display substrate provided by the embodiment of the present disclosure, the cathode auxiliary layer is arranged to effectively reduce the voltage drop (VSS drop) of the power signal transmitted by the cathode layer 30, to reduce the power consumption, and effectively ensure the display uniformity of the display substrate.

It is worth noting that it is verified through experiments that the display substrate provided by the embodiment of the present disclosure can realize that the first power line pattern 501 transmits the negative power signal to the cathode layer 30 located in the display area 10 through the cathode auxiliary layer, so that the cathode signal is transmitted to each sub-pixel in the display area 10.

Figure 10:
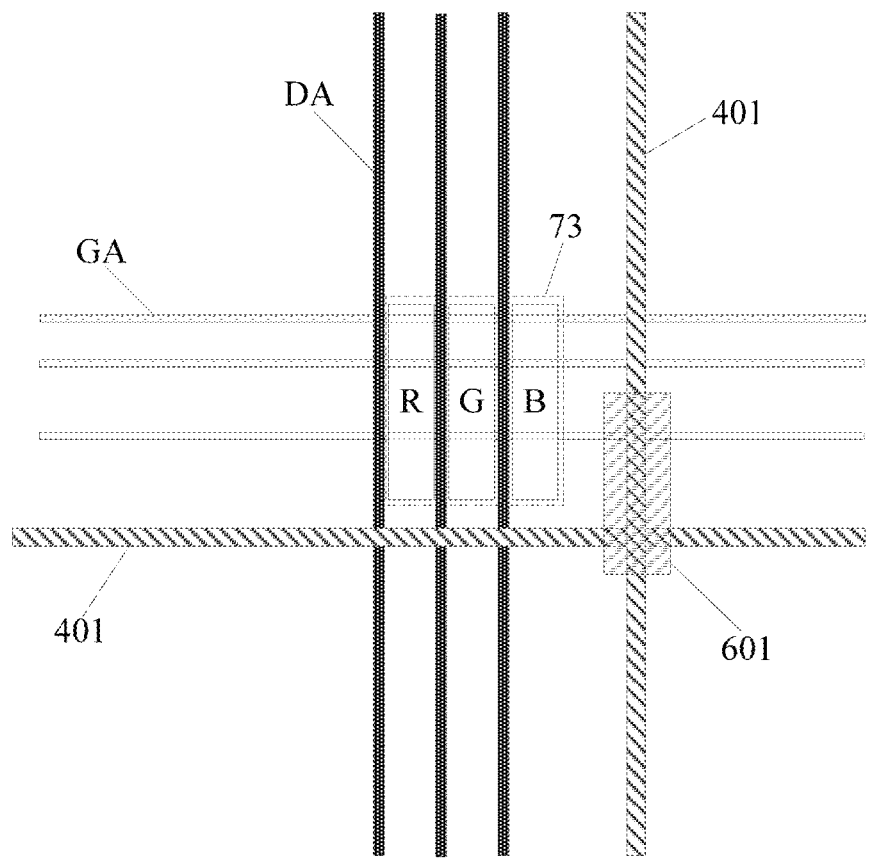
FIG. 10 is a schematic diagram of the positions of a pixel unit and a first connection pattern according to an embodiment of the present disclosure.

As shown in FIG. 2, FIG. 3 and FIG. 10, in some embodiments, the cathode auxiliary layer includes a first auxiliary portion 401, and at least part of the first auxiliary portion 401 is located in the display area 10, and the first auxiliary portion 401 is of a grid structure, in the display area 10, the first auxiliary portion 401 is coupled to the cathode layer 30.

Exemplarily, the first auxiliary portion 401 can extend from the display area 10 to the peripheral area 20.

Exemplarily, the display substrate further includes a gate line GA and a data line DA, the gate line GA includes a portion extending along a first direction, and the data line DA includes a portion extending along a second direction. The first direction intersects the second direction. Exemplarily, the first direction includes the X direction, and the second direction includes the Y direction.

Exemplarily, the first auxiliary portion 401 is of a grid structure, and the first auxiliary portion 401 includes a plurality of first auxiliary lines and a plurality of second auxiliary lines, the first auxiliary lines and the second auxiliary lines are crossed to each other. Exemplarily, the first auxiliary line includes a portion extending along the first direction, and the second auxiliary line includes a portion extending along the second direction. Exemplarily, the first auxiliary line and the second auxiliary line form an integral structure.

Exemplarily, in the display area 10, the first auxiliary portion 401 is coupled to the cathode layer 30 at a plurality of positions.

In the display substrate provided by the above embodiment, the first auxiliary portion 401 is of a grid structure, and the first auxiliary portion 401 is coupled to the cathode layer 30, so that the first power line pattern 501 can transmit the negative power signal to the cathode layer 30 in the display area 10 through the cathode auxiliary layer, so that the cathode signal is transmitted to each sub-pixel in the display area 10.

Moreover, in the display substrate provided by the above-mentioned embodiment, the cathode auxiliary layer is of a grid structure, and the first auxiliary portion 401 is coupled to the cathode layer 30, so as to effectively reduce the voltage drop (VSS drop) of power signals transmitted by the cathode layer 30, reduce the power consumption and effectively ensure the display uniformity of the display substrate.

Figure 6:
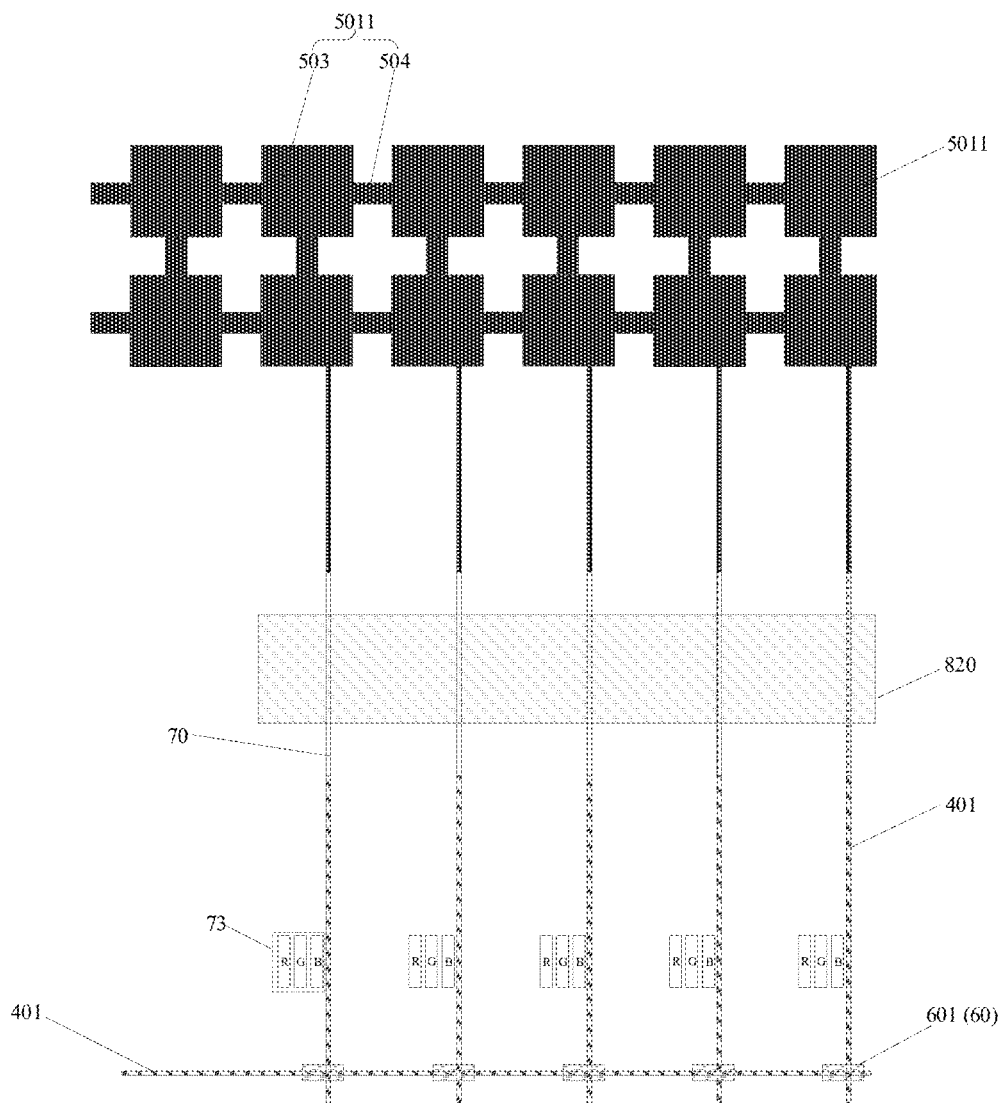
FIG. 6 is a schematic diagram of the coupling between the first auxiliary portion and the first power line pattern in FIG. 3.

As shown in FIG. 2, FIG. 3 and FIG. 6, in some embodiments, the display substrate further includes a bridging layer 70, and the bridging layer 70 is arranged at different layers from the cathode auxiliary layer and the power line layer; the first auxiliary portion 401 is coupled to the first power line pattern 501 through the bridging layer 70.

Exemplarily, the display substrate includes a first gate metal layer and a second gate metal layer, and the first gate metal layer is used to form scan lines and gate electrodes of transistors in the display substrate. The second gate metal layer is used to form a base plate of the storage capacitor included in the driving circuit in the display substrate, and a part of the signal lines.

Exemplarily, the bridging layer 70 and the first gate metal layer are arranged at the same layer and made of the same material; or, the bridging layer 70 and the second gate metal layer are arranged at the same layer and made of the same material. This arrangement is beneficial to simplify the manufacturing process flow of the display substrate and reduce the manufacturing cost of the display substrate.

As shown in FIG. 1, FIG. 2, FIG. 3, FIG. 5 and FIG. 6, the display substrate further includes a positive power line located in the peripheral region 20, and an orthographic projection of a first target portion 820 of the positive power line on the substrate 90 is located between an orthographic projection of the first power line pattern 501 on the substrate 90 and an orthographic projection of the display area 10 on the substrate 90. Exemplarily, the first target portion 820 and the first auxiliary portion 401 are arranged at the same layer and made of the same material.

The above arrangement of the first auxiliary portion 401 to be coupled to the first power line pattern 501 through the bridging layer 70 can avoid the short circuit between the first auxiliary portion 401 and the positive power line, and ensure the reliability and working stability of the display substrate.

As shown in FIGS. 3 to 7, in some embodiments, the cathode auxiliary layer further includes a second auxiliary portion 402 located in the peripheral region 20, and the second auxiliary portion 402 is close to the first side of the display region 10. The second auxiliary portion 402 is coupled to the first power line pattern 501.

Exemplarily, an orthographic projection of the second auxiliary portion 402 on the substrate 90 of the display substrate at least partially overlaps the orthographic projection of the first power line pattern 501 on the substrate 90, the second auxiliary portions 402 and the first power line pattern 501 are coupled to each other through a via hole at the overlapping area.

Exemplarily, the first auxiliary portion 401 and the second auxiliary portion 402 can be formed simultaneously in the same patterning process.

Exemplarily, the first power line pattern 501 is coupled to the cathode layer 30 located in the peripheral region 20 through the second auxiliary portion 402.

The above arrangement of the second auxiliary portion 402 to be coupled to the first power line pattern 501 is beneficial to improve the electrical connection performance between the first power line pattern 501 and the cathode layer 30 located in the peripheral area 20. Moreover, it is beneficial to reduce the voltage drop (VSS drop) of the power signal transmitted by the cathode layer 30, thereby reducing the power consumption of the display substrate.

As shown in FIG. 1, FIG. 3, FIG. 4, FIG. 5, FIG. 6 and FIG. 10, in some embodiments, the display substrate further includes:

A connection layer 60, the connection layer 60 is located between the cathode auxiliary layer and the cathode layer 30, and the connection layer 60 includes a plurality of first connection patterns 601 located in the display area 10. In the display area 10, the first auxiliary portion 401 is coupled to the cathode layer 30 through the plurality of first connection patterns 601.

Exemplarily, the connection layer 60 includes a plurality of first connection patterns 601 independent of each other, and the plurality of first connection patterns 601 are arranged in the display area 10 in an array.

Exemplarily, the orthographic projection of the first connection pattern 601 on the substrate 90 at least partially overlaps the orthographic projection of the first auxiliary portion 401 on the substrate 90. The first connection pattern 601 is coupled to the first auxiliary portion 401 at the overlapping area.

Exemplarily, in the first auxiliary portion 401, there is an overlapping area between an orthographic projection of a part where the first auxiliary line and the second auxiliary line intersect on the substrate 90 and the orthographic projection of the first connection pattern 601 on the substrate 90.

The above arrangement that the connection layer is located between the cathode auxiliary layer and the cathode layer 30, and the first auxiliary portion 401 is coupled to the cathode layer 30 through the plurality of first connection patterns 601, not only reduces the difficulty of the connection between the first auxiliary portion 401 and the cathode layer 30, but also effectively improves the reliability of the connection between the first auxiliary portion 401 and the cathode layer 30.

As shown in FIG. 6 and FIG. 10, in some embodiments, the display substrate further includes: a plurality of pixel units 73 arranged in an array, the pixel units 73 include an anode pattern group, and the orthographic projection of the first connection pattern 601 on the substrate 90 of the display substrate is located at the periphery of the orthographic projection of the anode pattern group on the substrate 90.

Exemplarily, the pixel unit 73 includes a red sub-pixel R, a green sub-pixel G and a blue sub-pixel B. Each sub-pixel includes a corresponding anode pattern, and a plurality of anode patterns in the plurality of sub-pixels included in the pixel unit 73 form the anode pattern group.

Exemplarily, the plurality of first connection patterns 601 are in one-to-one correspondence with at least part of the pixel units 73, and the orthographic projection of the first connection patterns 601 on the substrate 90 is located at the periphery of the orthographic projection of the anode pattern group on the substrate 90.

In the display substrate provided by the above embodiment, the orthographic projection of the first connection pattern 601 on the substrate 90 of the display substrate is located at the periphery of the orthographic projection of the anode pattern group on the substrate 90, which not only ensures the uniformity of the distribution of the first connection patterns 601, but also avoids the influence of the first connection pattern 601 on the aperture ratio of the sub-pixels in the display substrate.

As shown in FIG. 1, FIG. 3 to FIG. 9, in some embodiments, the connection layer 60 further includes: a second connection pattern 602 located in the peripheral area 20, and the second connection pattern 602 is close to the first side of the display area 10, the second auxiliary portion 402 is coupled to the cathode layer 30 through the second connection pattern 602.

Exemplarily, the second connection pattern 602 and the first connection pattern 601 are arranged at the same layer and made of the same material. The second connection pattern 602 and the first connection pattern 601 are independent structures.

Exemplarily, the orthographic projection of the second connection pattern 602 on the substrate 90 at least partially overlaps the orthographic projection of the second auxiliary portion 402 on the substrate 90, and the second connection pattern 602 is coupled to the second auxiliary portion 402 at the overlapping area. The orthographic projection of the second connection pattern 602 on the substrate 90 at least partially overlaps the orthographic projection of a portion of the cathode layer 30 located in the peripheral region 20 on the substrate 90, and the second connection pattern 602 is coupled to the portion of the cathode layer 30 located in the peripheral area 20 at the overlapping area.

The above arrangement that the second auxiliary portion 402 is coupled to the cathode layer 30 through the second connection pattern 602 not only reduces the difficulty of connection between the second auxiliary portion 402 and the cathode layer 30, but also effectively improves the reliability of the connection between the second auxiliary portion 402 and the cathode layer 30.

As shown in FIG. 1 and FIG. 2, in some embodiments, the power line layer further includes: a second power line pattern 502, the second power line pattern 502 is close to the second side of the display area 10, the first side and the second side are opposite;

The first auxiliary portion 401 is coupled to the second power line pattern 502 through the bridging layer 70;

The cathode auxiliary layer further includes a third auxiliary portion located in the peripheral area 20, the third auxiliary portion is close to the second side of the display area 10; the third auxiliary portion is coupled to the second power line pattern 502.

Exemplarily, both the second power line pattern 502 and the first power line pattern 501 have an approximately same extension direction as that of the gate line GA.

Exemplarily, the orthographic projection of the second target portion 821 of the positive power line on the substrate 90 is located between the orthographic projection of the second power line pattern 502 on the substrate 90 and the orthographic projection of display area 10 on the substrate 90. Exemplarily, the second target portion 821 and the first auxiliary portion 401 are arranged at the same layer and made of the same material.

Exemplarily, the third auxiliary portion and the first auxiliary portion 401 are arranged at the same layer and made of the same material. Exemplarily, the third auxiliary portion and the first auxiliary portion 401 are independent of each other.

Exemplarily, the orthographic projection of the third auxiliary portion on the substrate 90 at least partially overlaps the orthographic projection of the second power line pattern 502 on the substrate 90, and the third auxiliary portion and the second power line pattern 502 are coupled through a via hole at the overlapping area.

The power line layer further includes the second power line pattern 502, which further reduces the power consumption of the cathode layer 30. The above arrangement of the first auxiliary portion 401 to be coupled to the second power line pattern 502 through the bridging layer 70 can avoid the short circuit between the first auxiliary portion 401 and the positive power line, and ensure the reliability and working stability of the display substrate.

In some embodiments, the connection layer further includes: a third connection pattern located in the peripheral area 20, the third connection pattern is close to the second side of the display area 10, and the third auxiliary portion is coupled to the cathode layer 30 through the third connection pattern.

Exemplarily, the third connection pattern and the first connection pattern 601 are arranged at the same layer and made of the same material. The third connection pattern and the first connection pattern 601 are independent structures.

Exemplarily, the orthographic projection of the third connection pattern on the substrate 90 at least partially overlaps the orthographic projection of the third auxiliary portion on the substrate 90, and the third connection pattern and the third auxiliary portion are coupled at this overlapping area. The orthographic projection of the third connection pattern on the substrate 90 at least partially overlaps the orthographic projection of the portion of the cathode layer 30 located in the peripheral region 20 on the substrate 90, and the third connection pattern and the portion of the cathode layer 30 located in the peripheral region 20 are coupled at this overlapping area.

The above arrangement that the third auxiliary portion is coupled to the cathode layer 30 through the third connection pattern not only reduces the difficulty of connection between the third auxiliary portion and the cathode layer 30, but also effectively improves the reliability of the connection between the third auxiliary portion and the cathode layer 30.

Figure 8:
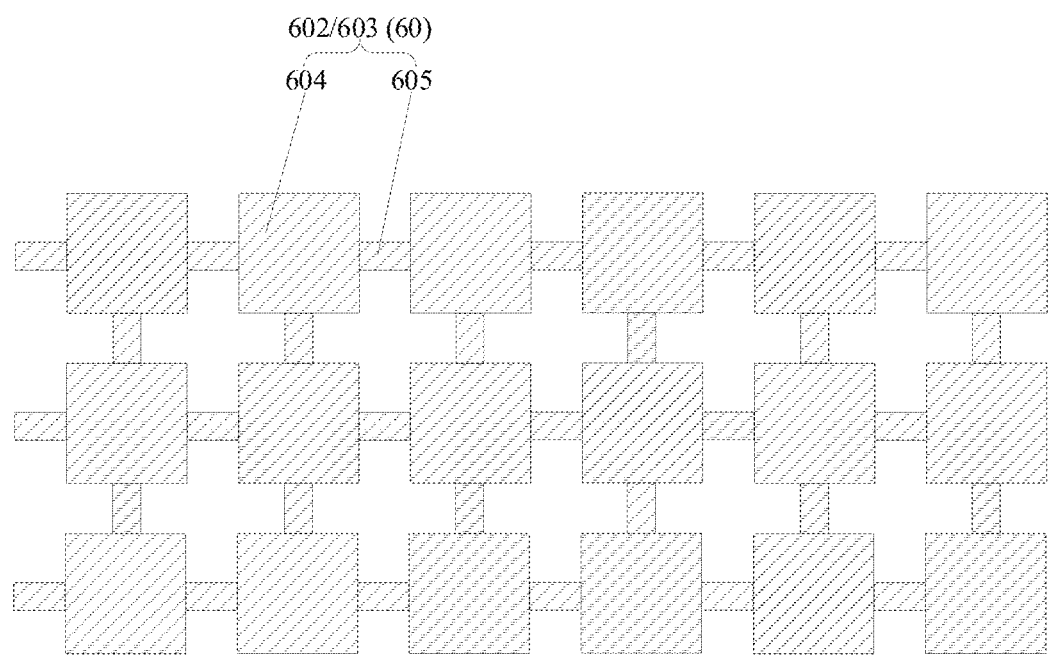
FIG. 8 is the schematic diagram of the second connection pattern in FIG. 3.

As shown in FIG. 8, in some embodiments, the second connection pattern 602 and the third connection pattern 603 each includes a plurality of first connection sub-patterns 604 and a plurality of second connection sub-patterns 605; the plurality of first connection sub-patterns 604 are arranged in an array, and adjacent first connection sub-patterns 604 are coupled to each other through the second connection sub-pattern 605.

Exemplarily, the size of the first connection sub-pattern 604 is larger than the size of the second connection sub-pattern 605.

Exemplarily, each of the first connection sub-pattern 604 and the second connection sub-pattern 605 includes a rectangle. Exemplarily, the first connection sub-pattern 604 includes a square, and the second connection sub-pattern 605 includes a rectangle.

The above arrangement not only effectively reduces the voltage drop of the cathode layer 30, but also reduces the parasitic capacitance between the connection layer and other conductive layers, which is beneficial to improve the working performance of the display substrate.

Figure 7:
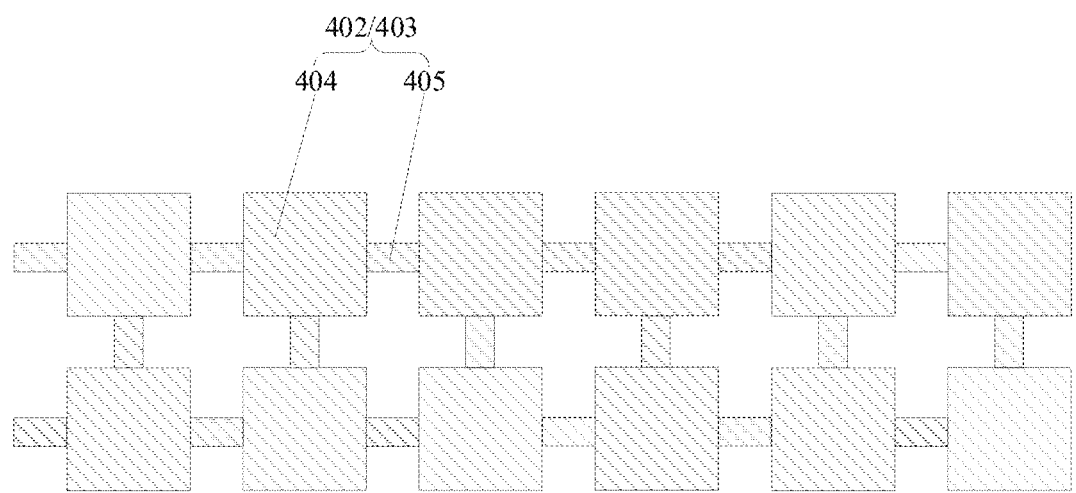
FIG. 7 is the schematic diagram of the second auxiliary portion in FIG. 3.

As shown in FIG. 7, in some embodiments, each of the second auxiliary portion 402 and the third auxiliary portion 403 includes a plurality of first auxiliary sub-patterns 404 and a plurality of second auxiliary sub-patterns 405, the plurality of first auxiliary sub-patterns 404 are arranged in an array, and adjacent first auxiliary sub-patterns 404 are coupled to each other through the second auxiliary sub-patterns 405.

Exemplarily, the size of the first auxiliary sub-pattern 404 is larger than the size of the second auxiliary sub-pattern 405.

Exemplarily, each of the first auxiliary sub-pattern 404 and the second auxiliary sub-pattern 405 includes a rectangle. Exemplarily, the first auxiliary sub-pattern 404 includes a square, and the second auxiliary sub-pattern 405 includes a rectangle.

The above arrangement not only effectively reduces the voltage drop of the cathode layer 30, but also reduces the parasitic capacitance between the cathode auxiliary layer and other conductive layers, which is beneficial to improve the working performance of the display substrate.

As shown in FIG. 2, FIG. 6 and FIG. 7, in some embodiments, the display substrate further includes a driver chip;

The first power line pattern 501 includes a first sub-pattern 5011 and two second sub-patterns 5012; the first sub-pattern 5011 is located between the two second sub-patterns 5012 and the display area 10, the first sub-pattern 5011 includes a portion extending along the first direction, the second sub-pattern 5012 includes a portion extending along the second direction, and the first direction intersects the second direction; the first sub-pattern 5011 is coupled to the second auxiliary portion 402; the two second sub patterns 5012 are coupled to two ends of the first sub-pattern 5011 respectively, and the two second sub-patterns 5012 are also respectively coupled to the driver chip;

Each of the first sub-pattern 5011 and the second power line pattern 502 includes: a plurality of first power sub-patterns 503 and a plurality of second power sub-patterns 504, and the plurality of first power sub-patterns 503 are arranged in an array, the adjacent first power sub-patterns 503 are coupled through the second power sub-pattern 504.

Exemplarily, the first sub-pattern 5011 and the two second sub-patterns 5012 are formed in a U-shaped structure. Exemplarily, the positive power line further includes a third target portion 822, and the third target portion 822 is coupled to the driver chip and receives the positive power signal provided by the driver chip. The third target portion 822 is partially surrounded by the first power line pattern 501. The first target portion 820, the second target portion 821 and the third target portion are electrically connected.

Exemplarily, the first sub-pattern 5011 and the two second sub-patterns 5012 form an integral structure.

Exemplarily, the size of the first power sub-pattern 503 is larger than the size of the second power sub-pattern 504.

Exemplarily, each of the first power sub-pattern 503 and the second power sub-pattern 504 includes a rectangle. Exemplarily, the first power sub-pattern 503 includes a square, and the second power sub-pattern 504 includes a rectangle.

The above arrangement not only effectively reduces the voltage drop of the cathode layer 30, but also reduces the parasitic capacitance between the power line layer and other conductive layers, which is beneficial to improve the working performance of the display substrate.

As shown in FIG. 5 to FIG. 8, in some embodiments, the orthographic projection of at least part of the first connection sub-pattern 604 on the substrate 90 of the display substrate coincides with the orthographic projection of at least part of the first auxiliary sub-pattern 404 on the substrate 90, and coincides with the orthographic projection of at least part of the first power sub-pattern 503 on the substrate 90; and/or, The orthographic projection of at least part of the second connection sub-pattern 605 on the substrate 90 coincides with the orthographic projection of at least part of the second auxiliary sub-pattern 405 on the substrate 90, and coincides with the orthographic projection of at least part of the second power sub-pattern 504 on the substrate 90.

Exemplarily, there is a first coinciding area among the orthographic projection of at least part of the first connection sub-pattern 604 on the substrate 90 of the display substrate, and the orthographic projection of at least part of the first auxiliary sub-pattern 404 on the substrate 90, and orthographic projection of at least part of the first power sub-pattern 503 on the substrate 90.

The orthographic projection of the first connection via hole between at least part of the first connection sub-pattern 604 and at least part of the first auxiliary sub-pattern 404 on the substrate 90 is surrounded by the first coinciding area. The shape of the orthographic projection of the first connection via hole between at least part of the first connection sub-pattern 604 and at least part of the first auxiliary sub-pattern 404 on the substrate 90 is roughly the same as the shape of the outline of the first coinciding area.

The orthographic projection of the second connection via hole between at least part of the first auxiliary sub-pattern 404 and at least part of the first power sub-pattern 503 on the substrate 90 is surrounded by the first coinciding area. The shape of the orthographic projection of the second connection via hole between at least part of the first auxiliary sub-pattern 404 and at least part of the first power sub-pattern 503 on the substrate 90 is roughly the same as the shape of the outline of the first coinciding area.

Exemplarily, there is a second coinciding area among the orthographic projection of at least part of the second connection sub-pattern 605 on the substrate 90, and the orthographic projection of at least part of the second auxiliary sub-pattern 405 on the substrate 90, and the orthographic projection of at least part of the second power sub-pattern 504 on the substrate 90.

The orthographic projection of the third connection via hole between at least part of the second connection sub-pattern 605 and at least part of the second auxiliary sub-pattern 405 on the substrate 90 is surrounded by the second coinciding area. The shape of the orthographic projection of the third connection via hole between at least part of the second connection sub-pattern 605 and at least part of the second auxiliary sub-pattern 405 on the substrate 90 is roughly the same as the shape of the outline of the second coinciding area.

The orthographic projection of the fourth connection via hole between at least part of the second auxiliary sub-pattern 405 and at least part of the second power sub-pattern 504 on the substrate 90 is surrounded by the second coinciding area. The shape of the orthographic projection of the fourth connection via hole between at least part of the second auxiliary sub-pattern 405 and at least part of the second power sub-pattern 504 on the substrate 90 is roughly the same as the shape of the outline of the second coinciding area.

Exemplarily, the first connection via hole is connected to the third connection via hole.

Exemplarily, the second connection via hole is connected to the fourth connection via hole.

The above arrangement can increase the overlapping area between the orthographic projection of the first connection sub-pattern 604 on the base 90 of the display substrate and the orthographic projection of the first auxiliary sub-pattern 404 on the substrate 90, so that when the first connection sub-pattern 604 is coupled to the first auxiliary sub-pattern 404 through a via hole, and the first auxiliary sub-pattern 404 is coupled to the first power sub-pattern 503 through a via hole, the contact area between the first connection sub-pattern 604 and the first auxiliary sub-pattern 404 can be increased, and the contact area between the first auxiliary sub-pattern 404 and the first power sub-pattern 503 is increased.

The above arrangement can increase the overlapping area between the orthographic projection of the second connection sub-pattern 605 on the substrate 90 of the display substrate and the orthographic projection of the second auxiliary sub-pattern 405 on the substrate 90, so that when the second connection sub-pattern 605 is coupled to the second auxiliary sub-pattern 405 through a via hole, and the second auxiliary sub-patterns 405 is coupled to the second power sub-pattern 504 through a via hole, the contact area between the second connection sub-pattern 605 and the second auxiliary sub-pattern 405 can be increased, and the contact area between the second auxiliary sub-pattern 405 and the second power sub-pattern 504 is increased.

It should be noted that, in the peripheral area 20, on the first side close to the display area 10, a boundary of the cathode layer 30 away from the display area 10, a boundary of the second connection pattern 602 away from the display area 10, a boundary of the first auxiliary portion 401 away from the display area 10 and a boundary of the first power sub-pattern 503 away from the display area 10 are arranged at different positions.

Exemplarily, the orthographic projection of the boundary of the cathode layer 30 away from the display area 10 on the substrate 90, the orthographic projection of the boundary of the second connection pattern 602 away from the display area 10 on the substrate 90, the orthographic projection of the boundary of the first auxiliary portion 401 away from the display area 10 on the substrate 90, and the orthographic projection of the boundary of the first power sub-pattern 503 away from the display area 10 on the substrate 90 coincide to each other.

Exemplarily, the orthographic projection of the boundary of the cathode layer 30 away from the display area 10 on the substrate 90, the orthographic projection of the boundary of the second connection pattern 602 away from the display area 10 on the substrate 90, the orthographic projection of the boundary of the first auxiliary portion 401 away from the display area 10 on the substrate 90 and the orthographic projection of the boundary of the first power sub-pattern 503 away from the display area 10 on the substrate 90 at least partially overlap to each other.

Exemplarily, the orthographic projection of the boundary of the cathode layer 30 away from the display area 10 on the substrate 90, the orthographic projection of the boundary of the second connection pattern 602 away from the display area 10 on the substrate 90, the orthographic projection of the boundary of the first auxiliary portion 401 away from the display area 10 on the substrate 90 and the orthographic projection of the boundary of the first power sub-pattern 503 away from the display area 10 on the substrate 90 are arranged in sequence along a direction away from the display area 10.

Exemplarily, the orthographic projection of the boundary of the cathode layer 30 away from the display area 10 on the substrate 90, the orthographic projection of the boundary of the second connection pattern 602 away from the display area 10 on the substrate 90, the orthographic projections of the boundary of the first auxiliary portion 401 away from the display area 10 on the substrate 90 are sequentially arranged in the direction away from the display area 10, and the orthographic projection of the boundary of the first auxiliary portion 401 away from the display area 10 on the substrate 90 at least partially overlaps the orthographic projection of the boundary of the first power sub-pattern 503 away from the display area 10 on the substrate 90.

In some embodiments, the display substrate further includes a first source-drain metal layer, a second source-drain metal layer, and an anode layer 76 that are sequentially stacked along a direction away from the substrate 90 of the display substrate; the power line layer and the first source-drain metal layer are arranged at the same layer and made of the same material, the cathode auxiliary layer and the second source-drain metal layer are arranged at the same layer and made of the same material, and the connection layer and the anode layer 76 are arranged at the same layer and made of the same material.

Exemplarily, the first source-drain metal layer is used to form the data line DA in the display substrate, the positive power line in the display area 10, and some conductive connection portions.

The above arrangement enables the power line layer and the first source-drain metal layer to be formed simultaneously in the same patterning process, so that the cathode auxiliary layer and the second source-drain metal layer can be formed in the same patterning process, and the connection layer and the anode layer 76 can be formed simultaneously in the same patterning process, which is beneficial to simplify the manufacturing process of the display substrate and reduce the manufacturing cost of the display substrate.

Figure 9:
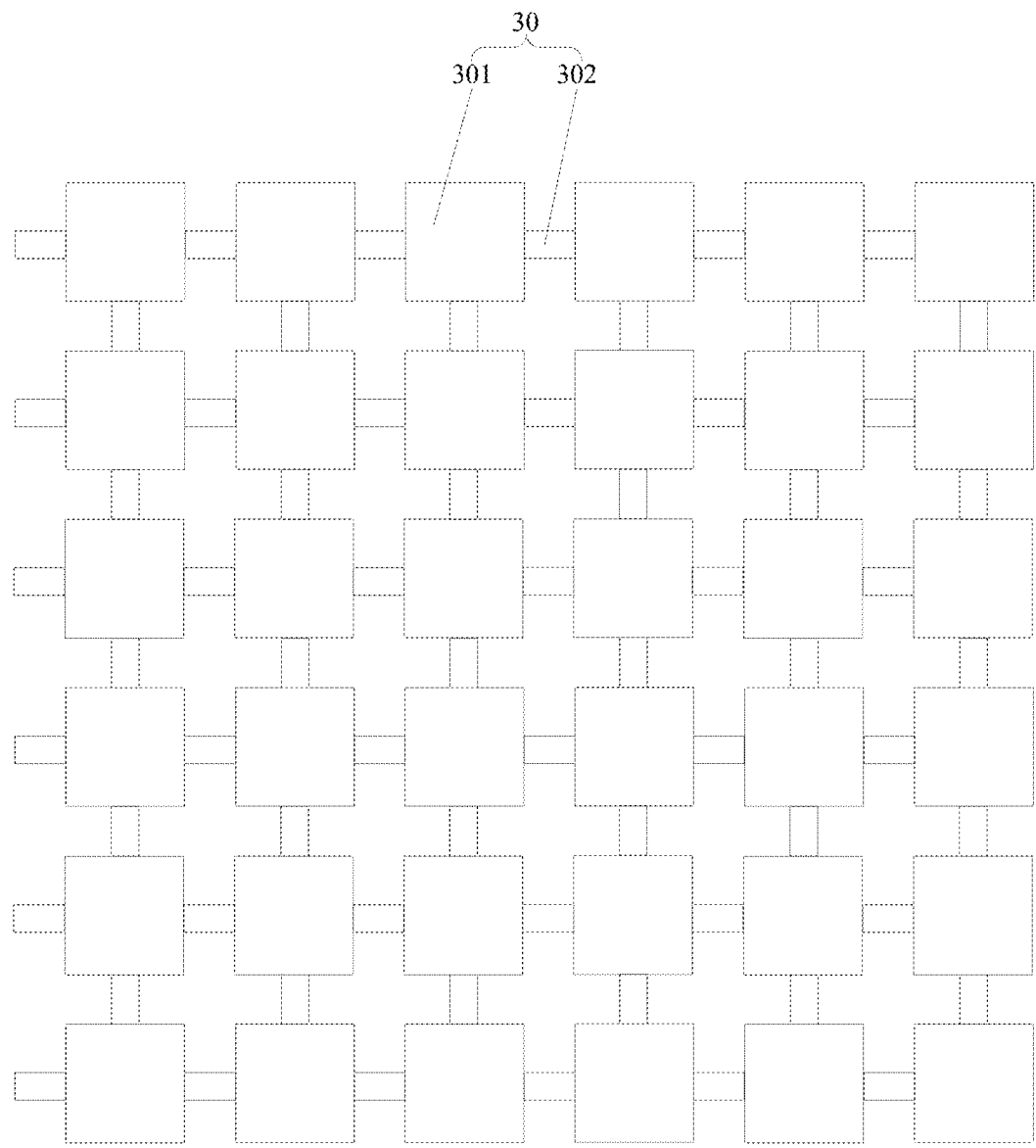
FIG. 9 is a first schematic diagram of a cathode layer provided by an embodiment of the present disclosure.

As shown in FIG. 9, in some embodiments, the cathode layer 30 includes a plurality of first cathode patterns 301 and a plurality of second cathode patterns 302; the plurality of first cathode patterns 301 are arranged in an array, adjacent first cathode patterns 301 are coupled to each other through the second cathode patterns 302.

Exemplarily, when the display area includes a first display region and a second display region, the cathode layer 30 of the above structure is used as a first cathode portion, at least part of the cathode layer 30 is located in the first display region.

Exemplarily, the first cathode pattern 301 and the second cathode pattern 302 form an integral structure.

Exemplarily, the size of the first cathode pattern 301 is larger than that of the second cathode pattern 302.

Exemplarily, each of the first cathode pattern 301 and the second cathode pattern 302 includes a rectangle. Exemplarily, the first cathode pattern 301 includes a square, and the second cathode pattern 302 includes a rectangle.

The cathode layer 30 includes a plurality of first cathode patterns 301 and a plurality of second cathode patterns 302, so that the cathode layer 30 is formed into a grid structure, which is beneficial to improve the transmittance of the display substrate and improve the working performance of the display substrate. In addition, the cathode layer 30 forms a grid structure and the cathode auxiliary layer includes the first auxiliary portion 401, which is beneficial to the uniformity of the negative power signal in the display substrate and the reliability of the negative supply signal provided to each sub-pixel in the display area 10.

The display substrate provided by the above embodiment adopts a transparent display design under the screen, and the camera is arranged in the second display region 102 in the display area 10. The cathode layer 30 in the display substrate is generally made of Mg and/or Ag. These materials have good conductivity but low transmittance. The cathode layer 30 made of these materials will affect the transmittance of the under-screen camera. Therefore, the cathode layer 30 needs to be specifically processed.

Exemplarily, the transmittance of the cathode layer 30 is improved by thinning the cathode layer 30. Exemplarily, using the CPM technology (i.e. OTI technology), utilizing the physical and chemical non-adhesion properties of the modified Mg and Mg/Ag and other materials, a layer of CPM material is vapor-deposited in advance in the position where the cathode layer 30 needs to be opened, and then the vapor-deposited Mg/Ag cannot be attached to the CPM, so as to form the patterned cathode layer 30 and improve the transmittance of the second display region 102. Exemplarily, the cathode layer 30 is patterned by means of mask evaporation. Exemplarily, the cathode layer 30 in the second display region 102 is patterned by means of laser irradiation. Compared with the previous solutions, the cathode layer 30 of the high-resolution display substrate is patterned by the method of laser, but it has higher requirements on the precision of the laser.

Figure 11:
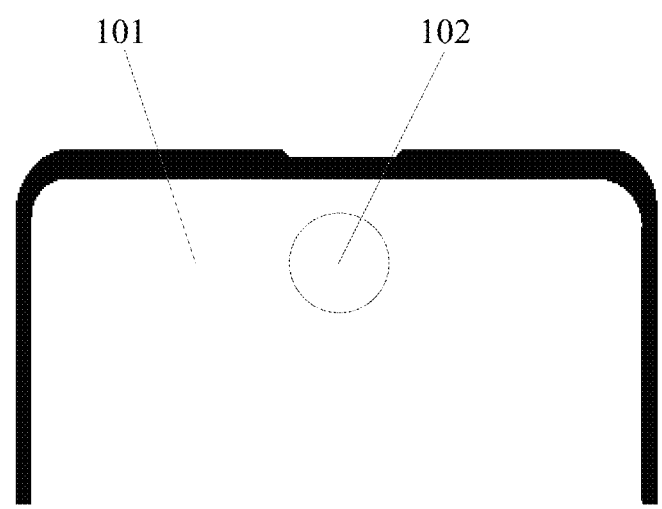
FIG. 11 is a schematic diagram of a first display region and a second display region provided by an embodiment of the present disclosure.
Figure 13:
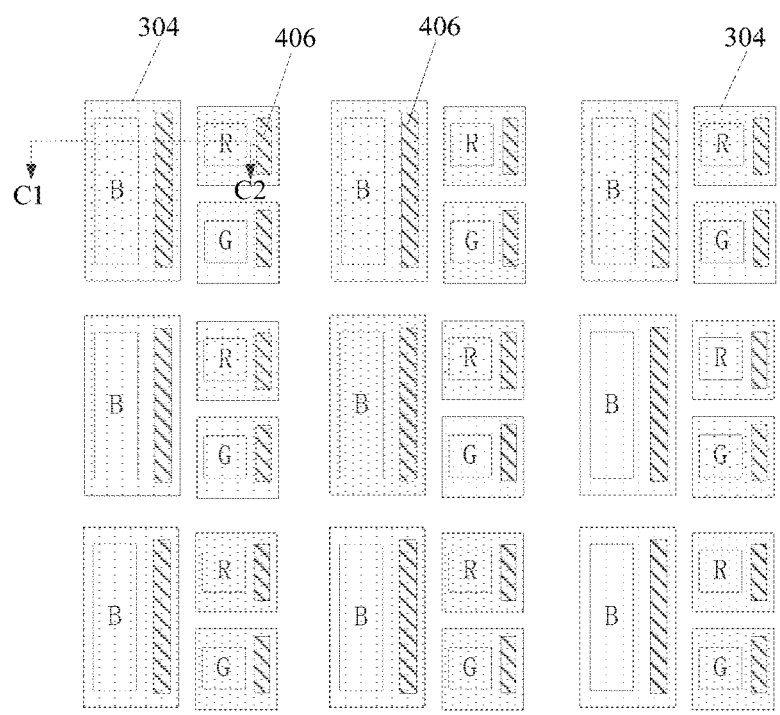
FIG. 13 is a schematic diagram of a third cathode pattern and a third auxiliary sub-pattern in the second display region provided by an embodiment of the present disclosure.
Figure 14:
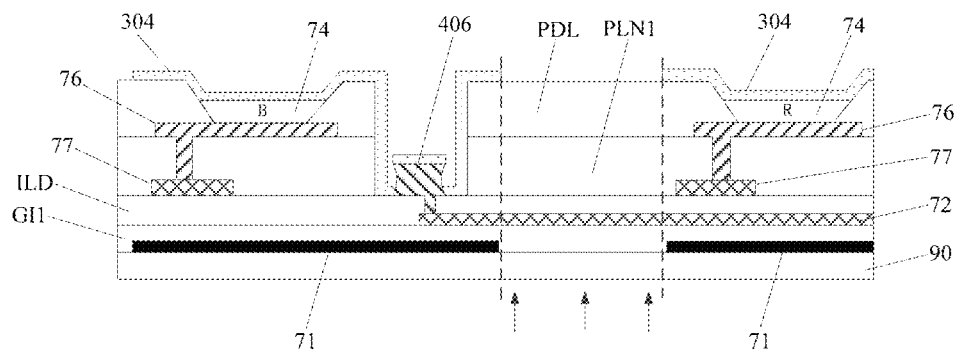
FIG. 14 is a schematic cross-sectional view along the C1C2 direction in FIG. 13.

As shown in FIG. 11, FIG. 13 and FIG. 14, in some embodiments, the display area 10 includes a first display region 101 and a second display region 102, and the second display region 102 is used for setting the camera components;

The cathode layer 30 includes a first cathode portion and a second cathode portion, the first cathode portion extends from the first display region 101 to the peripheral area 20, and the second cathode portion is located in the second display region 102; the second cathode portion includes a plurality of third cathode patterns 304;

The display substrate further includes a plurality of laser blocking patterns 71, the orthographic projections of the plurality of laser blocking patterns 71 on the base 90 of the display substrate coincide the orthographic projection of the plurality of third cathode patterns 304 on the base 90.

Figure 12:
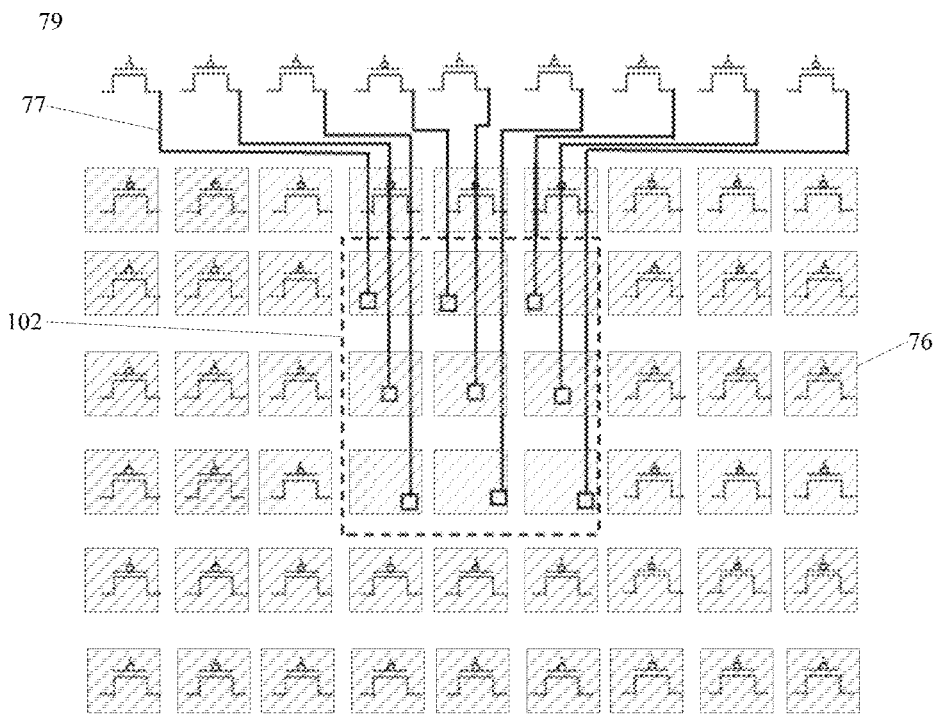
FIG. 12 is a schematic diagram of a layout of the pixel driving circuit in a second display region according to an embodiment of the present disclosure.

As shown in FIG. 12, the display area 10 includes a first display region 101 and a second display region 102, and the first display region 101 surrounds the second display region 102. Exemplarily, the first display region 101 and the second display region 102 are designed with a differentiated pixel driving circuit 79, that is, the anode pattern of the second display region 102 and the pixel driving circuit 79 are designed separately, the pixel driving circuit 79 in the second display region 102 is arranged in the first display region 101 (suitable for low-resolution display substrates) or the peripheral area 20 (suitable for high-resolution display substrates), the anode pattern of the second display region 102 is coupled to the corresponding pixel driving circuit 79 through the corresponding transparent connecting line 77. Exemplarily, the transparent connecting line 77 is made of indium tin oxide (ITO) material.

It should be noted that one transistor in FIG. 12 represents one pixel driving circuit 79, and one pixel driving circuit 79 may include a plurality of driving transistors.

Exemplarily, the first cathode portion and the second cathode portion are formed as independent structures.

Exemplarily, the second cathode portion includes a plurality of third cathode patterns 304 independent of each other.

Exemplarily, the plurality of laser blocking patterns 71 are in one-to-one correspondence with the plurality of third cathode patterns 304, and the orthographic projection of the laser blocking pattern 71 on the substrate 90 of the display substrate surrounds the orthographic projection of the third cathode pattern 304 on the substrate 90.

When the plurality of third cathode patterns 304 are formed by irradiating laser light (IR laser source or other laser light), the second display region 102 may be irradiated with laser light on the side of the substrate 90 away from the cathode layer 30, so that a portion of the second display region 102 that is not blocked by the laser blocking pattern 71 is evaporated, thereby forming the plurality of third cathode patterns 304. In addition, the line with an arrow in FIG. 14 represents the laser irradiation direction.

In the display substrate provided by the above embodiment, the laser blocking pattern 71 is used as a mask to form the plurality of third cathode patterns 304 by laser irradiation. The cathode layer 30 of the display substrate with high definition is patterned in a high accuracy without a high accuracy laser.

As shown in FIG. 14, in some embodiments, the display substrate further includes a driving transistor in the first display region 101; the laser blocking pattern 71 and the active layer of the driving transistor are arranged at the same layer and made of the same material.

Exemplarily, the active layer is formed using P—Si.

As mentioned above, the laser blocking pattern 71 and the active layer of the driving transistor are arranged at the same layer and made of the same material, so that the laser blocking pattern 71 and the active layer of the driving transistor can be formed in the same patterning process, which simplifies the manufacturing process of the display substrate and reduces the manufacturing cost of the display substrate.

As shown in FIG. 14, in some embodiments, the display substrate further includes a transparent conductive connection layer 72, and the transparent conductive connection layer 72 is respectively coupled to the plurality of third cathode patterns 304.

Exemplarily, the conductive connection layer is made of ITO material.

Exemplarily, the conductive connection layer can electrically connect the plurality of third cathode patterns 304 together.

Exemplarily, the conductive connection layer includes a plurality of conductive connection portions independent from each other, the adjacent third cathode patterns 304 are coupled to each other through the conductive connection portion, and a part of the conductive connection portions are coupled to the third cathode pattern 304 and the second power line pattern 502.

As shown in FIG. 1, FIG. 13 and FIG. 14, exemplarily, the transparent conductive connection layer 72 has a grid structure on the entire surface. The transparent conductive connection layer 72 extends from the second display region 102 to the peripheral area 20, the transparent conductive connection layer 72 is coupled to the second power line pattern 502 included in the power line layer, and the third cathode pattern 304 receives the negative power signal provided by the second power line pattern 502 through the transparent conductive connection layer 72.

Figure 4:
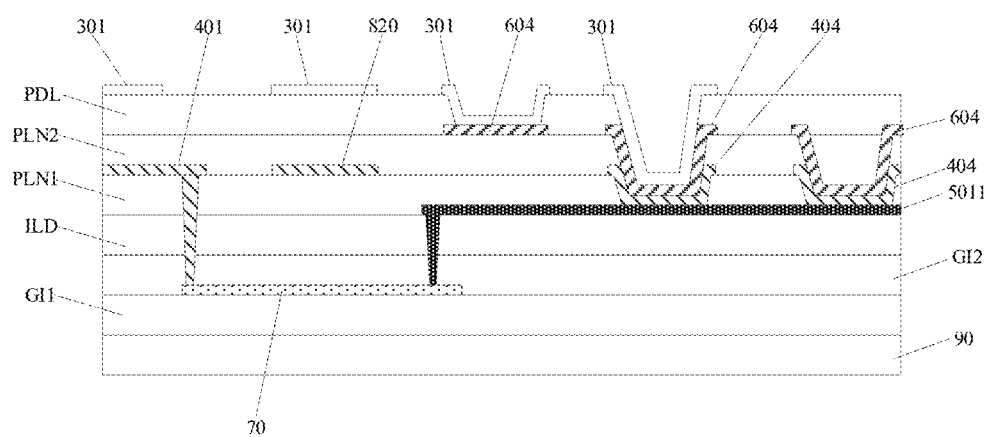
FIG. 4 is a schematic cross-sectional view along the A1A2 direction in FIG. 3.
Figure 5:
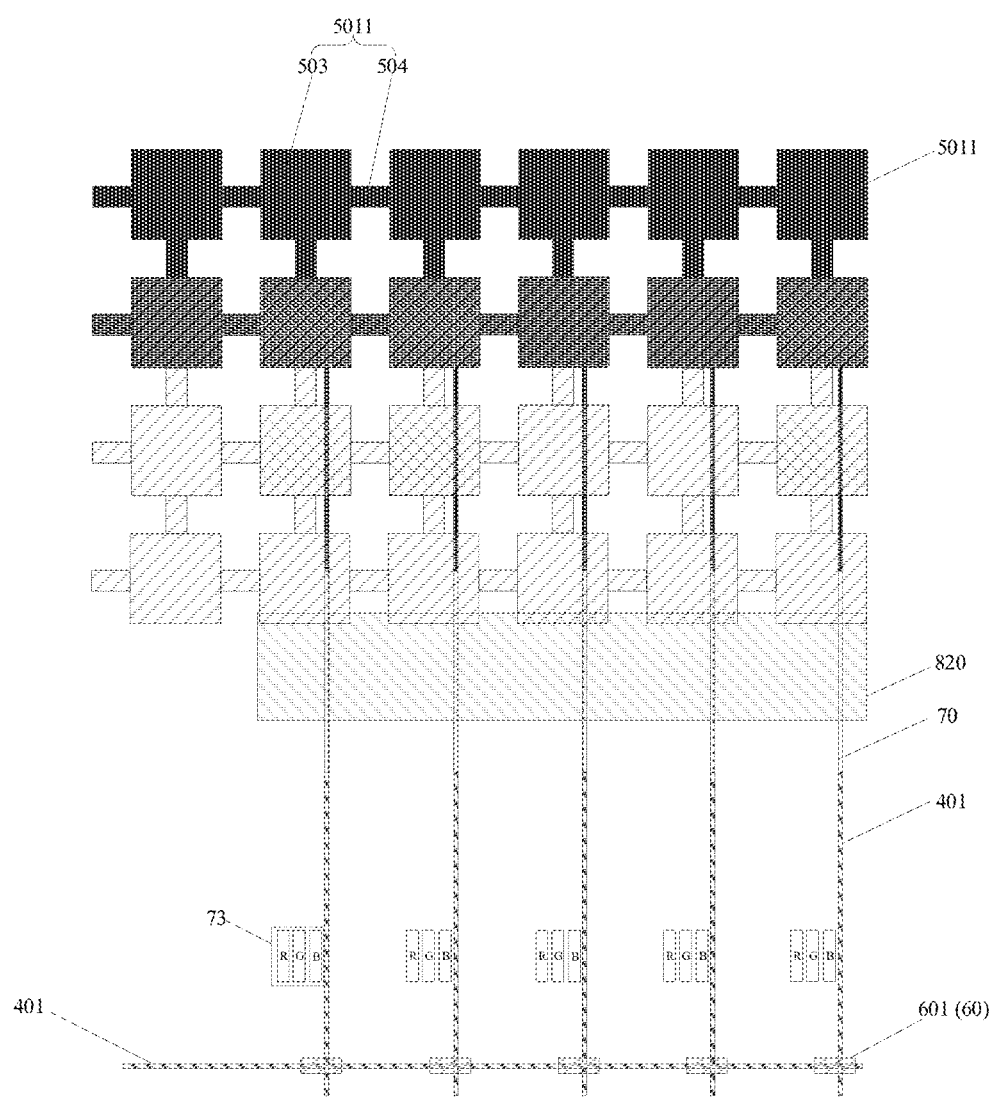
FIG. 5 is a schematic diagram of other film layers other than the cathode layer in FIG. 3.

As shown in FIG. 4 and FIG. 14, exemplarily, the display substrate includes an active layer, a first gate insulating layer GI1, a first gate metal layer, a second gate insulating layer GI2, a second gate metal layer, a interlayer insulating layer ILD, a first source-drain metal layer, a first planarization layer PLN1, a second source-drain metal layer, a second planarization layer PLN2, an anode layer 76, a pixel defining layer PDL, a light-emitting functional layer 74, a cathode layer 30 and an encapsulation layer that are sequentially stacked on the substrate 90 along a direction away from the substrate 90.

It should be noted that the second gate insulating layer GI2 and the second planarization layer PLN2 are not shown in FIG. 14.

Exemplarily, the display substrate further includes a first passivation layer and/or a second passivation layer, and the first passivation layer is located between the first source-drain metal layer and the first planarization layer, the second passivation layer is located between the second source-drain metal layer and the second planarization layer.

Exemplarily, the transparent conductive connection layer 72 is arranged on the same layer as the second gate metal layer, and is located between the second gate insulating layer and the interlayer insulating layer. Exemplarily, the transparent conductive connection layer 72 is arranged at the same layer as the first source-drain metal layer, and is located between the interlayer insulating layer and the first planarization layer.

Exemplarily, the transparent connecting line layer is arranged at the same layer as the first source-drain metal layer, and is located between the interlayer insulating layer and the first planarization layer. Exemplarily, the transparent connecting line layer is arranged at the same layer as the second source-drain metal layer and is located between the first planarization layer and the second planarization layer.

Figure 15:
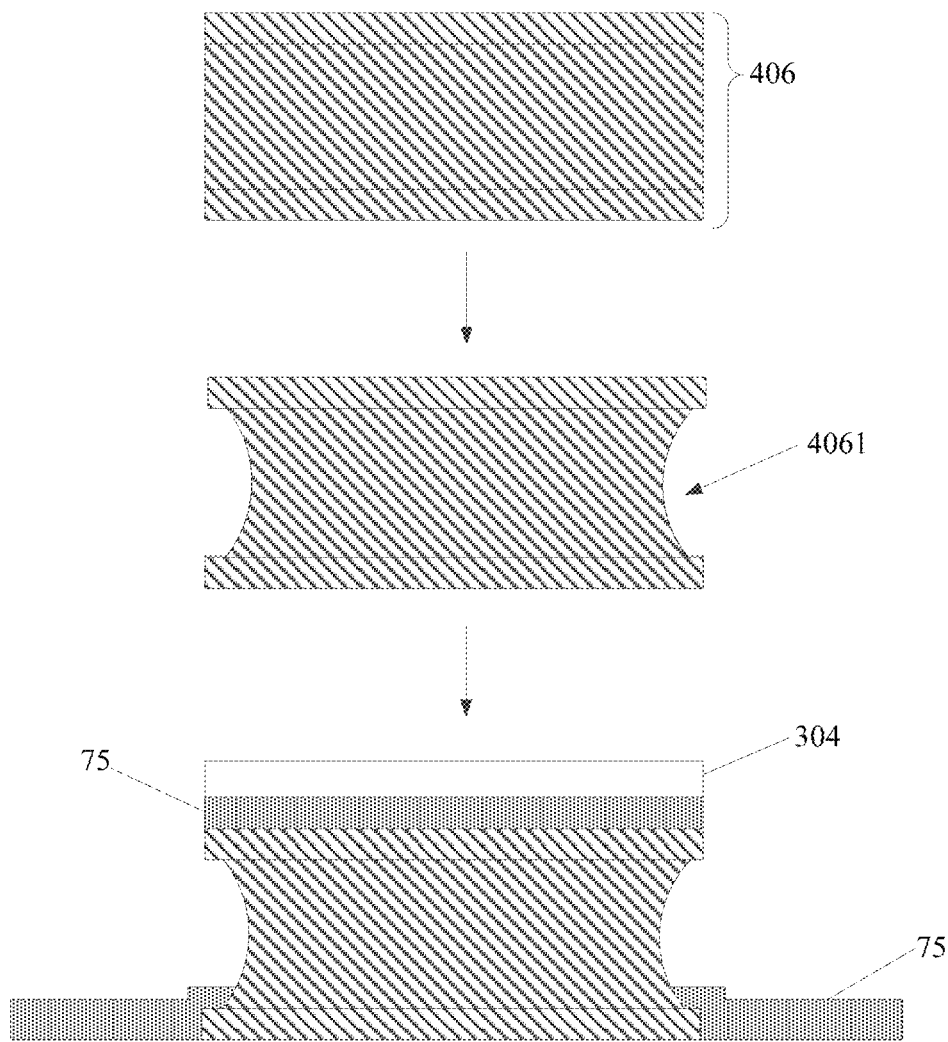
FIG. 15 is a schematic diagram of a third auxiliary sub-pattern separating a common layer according to an embodiment of the present disclosure.

As shown in FIG. 13 to FIG. 15, in some embodiments, the cathode auxiliary layer includes a fourth auxiliary portion, the fourth auxiliary portion is located in the second display region 102, and the fourth auxiliary portion includes a plurality of third auxiliary sub-patterns 406, the third auxiliary sub-pattern 406 is located between the transparent conductive connection layer 72 and the third cathode pattern 304, the transparent conductive connection layer 72 is coupled to the corresponding third cathode pattern 304 through the corresponding third auxiliary sub-pattern 406.

Exemplarily, the fourth auxiliary portion includes a plurality of third auxiliary sub-patterns 406 independent of each other, the plurality of third auxiliary sub-patterns 406 correspond to the plurality of third cathode patterns 304 in a one-to-one manner, and the transparent conductive connection layer 72 is coupled to the corresponding third cathode pattern 304 through the corresponding third auxiliary sub-pattern 406.

Exemplarily, the orthographic projection of the third auxiliary sub-pattern 406 on the substrate 90 at least partially overlaps the orthographic projection of the corresponding third cathode pattern 304 on the substrate 90. Exemplarily, the orthographic projection of the third auxiliary sub-pattern 406 on the substrate 90 is completely covered by the orthographic projection of the corresponding third cathode pattern 304 on the substrate 90.

Exemplarily, the third auxiliary sub-pattern 406 and the second source-drain metal layer are arranged at the same layer and made of the same material. Exemplarily, the third auxiliary sub-pattern 406 and the first source-drain metal layer are arranged at the same layer and made of the same material.

The transparent conductive connection layer 72 is coupled to the corresponding third cathode pattern 304 through the corresponding third auxiliary sub-pattern 406, which reduces the coupling difficulty of the transparent conductive connection layer 72 and the third cathode pattern 304, and improves the reliability of the electrical connection between the transparent conductive connection layer 72 and the third cathode pattern 304.

As shown in FIG. 13 to FIG. 15, in some embodiments, the side surface of the third auxiliary sub-pattern 406 is provided with a notch 4061;

The display substrate further includes an anode layer 76, a light-emitting functional layer 74 and a common layer 75; the light-emitting functional layer 74 and the common layer 75 are located between the anode layer 76 and the cathode layer 30, and the light-emitting functional layer 74 and the common layer 75 are stacked; the common layer 75 is disconnected at the notch 4061 of the third auxiliary sub-pattern 406.

Exemplarily, the third auxiliary sub-pattern 406 has a stacked structure, including a stacked Ti/Al/Ti structure. When the anode layer 76 is formed by wet etching, the etching solution will simultaneously etch the side portion of the Al layer in the third auxiliary sub-pattern 406, and the side surface of the third auxiliary sub-pattern 406 is provided with the notch 4061 (i.e. the UnderCut structure).

Exemplarily, the common layer 75 includes a hole injection layer, a hole transport layer, an electron transport layer and an electron injection layer that are stacked. The light-emitting functional layer 74 is located between the hole transport layer and the electron transport layer.

In the related art, the process of forming the hole injection layer, the hole transport layer, the electron transport layer and the electron injection layer requires a patterning process (a mask process), and adjacent sub-pixels under the hole injection layer, the hole transport layer, the electron transport layer and the electron injection layer are separated to avoid color mixing between the adjacent sub-pixels.

In the display substrate provided by the above-mentioned embodiment, the side surface of the third auxiliary sub-pattern 406 is provided with a notch 4061, so that the common layer 75 is disconnected at the notch 4061 of the third auxiliary sub-pattern 406. Therefore, in the manufacturing process of the display substrate provided by the above-mentioned embodiments, the mask process for forming the hole injection layer, the hole transport layer, the electron transport layer and the electron injection layer is avoided, which effectively simplifies the manufacturing process flow of the display substrate and reduces the manufacturing cost of the display substrate.

As shown in FIG. 1, in some embodiments, the display substrate further includes:
  a first initialization signal line 80 located in the peripheral area 20, and the first initialization signal line 80 is close to the first side of the display area 10;
  a second initialization signal line 81 located in the peripheral area 20, the second initialization signal line 81 is close to the second side of the display area 10, and the second side is opposite to the first side;
  an initialization signal layer extending from the display area 10 to the peripheral area 20, and the initialization signal layer is respectively coupled to the first initialization signal line 80 and the second initialization signal line 81.

Exemplarily, each of the first initialization signal line 80 and the second initialization signal line 81 includes a portion extending along the first direction. The first initialization signal line 80 is coupled to the driver chip, and receives an initialization signal provided by the driver chip.

Exemplarily, the initialization signal line layer is formed in a grid structure. The initialization signal line layer includes a first layer and a second layer, the first layer and the second gate metal layer are arranged at the same layer and made of the same material, and the second layer and the first source-drain metal layer are arranged at the same layer and made of the same material. The first layer includes a plurality of first sub-signal lines extending in a first direction, the second layer includes a plurality of second sub-signal lines extending in a second direction, and the plurality of first sub-signal lines and the plurality of second sub-signal lines are crossed and coupled to each other, so as form the initialization signal line layer of a grid shape.

Exemplarily, the second layer can extend from the display area 10 to the peripheral area 20, and the second layer is respectively coupled to the first initialization signal line 80 and the second initialization signal line 81.

In the peripheral area 20, the middle of a region close to the third side and the fourth side of the display area 10 includes initialization signal lines, which can further reduce the size of frame width of the display substrate on the third side and the fourth side.

Embodiments of the present disclosure further provide a display device including the display substrate provided by the above embodiments.

Exemplarily, the display device includes an active matrix organic light emitting diode display device.

In the display substrate provided by the above embodiment, the cathode auxiliary layer extends from the display area 10 to the peripheral area 20, and the cathode auxiliary layer can be coupled to the cathode layer 30 in the display area 10, and coupled to the first power line pattern 501 in the peripheral area 20, so as to realize the coupling between the cathode layer 30 and the first power line pattern 501. In the display substrate provided by the above embodiment, the power line layer may be provided only at a position of the peripheral area 20 close to the first side (e.g., the upper side) of the display area 10, that is, no power line layer is provided at positions of the peripheral area 20 close to the other sides (such as the left and right sides) of the display substrate 10, which effectively reduces the width of the frame of the display substrate close to the other sides of the display area 10, which is beneficial to the development of the narrow frame of the display substrate. Moreover, in the display substrate provided by the above embodiment, the voltage drop (VSS drop) of the power signal transmitted by the cathode layer 30 is effectively reduced by providing the cathode auxiliary layer, the power consumption is reduced, and the display uniformity of the display substrate is effectively ensured.

Therefore, when the display device provided by the embodiment of the present disclosure includes the above-mentioned display substrate, it also has the above-mentioned beneficial effects, which will not be repeated here.

It should be noted that the display device can be any product or component with a display function, such as a TV, a monitor, a digital photo frame, a mobile phone, a tablet computer, etc., wherein the display device also includes a flexible circuit board, a printed circuit board and a back plate etc.

It should be noted that the "same layer" in the embodiments of the present disclosure may refer to a film layer on the same structural layer. Or, for example, the film layers in the same layer may be a layer structure formed by using the same film forming process to form a film layer for forming a specific pattern, and then using the same mask to pattern the film layer through one patterning process. Depending on the specific pattern, one patterning process may include multiple exposure, development or etching processes, and the specific patterns in the formed layer structure may be continuous or discontinuous. These specific patterns may also be at different heights or have different thicknesses.

In the method embodiments of the present disclosure, the sequence numbers of the steps are not used to limit the sequence of the steps. For those of ordinary skill in the art, the sequence of the steps can be changed without creative work and also within the scope of protection of the present disclosure.

It should be noted that the various embodiments in this specification are described in a progressive manner, and the same or similar portions among the various embodiments can be referred to each other, and each embodiment focuses on the differences from other embodiments. In particular, for the method embodiment, since it is basically similar to the product embodiment, the description is relatively simple, and the relevant portion can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a driver chip, a display area and a peripheral area surrounding the display area, wherein the driver chip is located in the peripheral area, the driver chip is close to a first side of the display area; the display substrate further includes:
    a cathode layer, wherein the cathode layer extends from the display area to the peripheral area;
    a cathode auxiliary layer, wherein the cathode auxiliary layer extends from the display area to the peripheral area, and the cathode auxiliary layer is coupled to the cathode layer in the display area;
    a power line layer, wherein the power line layer is located in the peripheral area, the power line layer includes a first power line pattern, and the first power line pattern is close to the first side of the display area; the first power line pattern is coupled to the cathode auxiliary layer;
    wherein the cathode layer includes a plurality of first cathode patterns and a plurality of second cathode patterns; the plurality of first cathode patterns are arranged in an array, adjacent first cathode patterns are coupled to each other through the second cathode pattern.

2. The display substrate according to claim 1, wherein the cathode auxiliary layer includes a first auxiliary portion, and at least part of the first auxiliary portion is located in the display area, and the first auxiliary portion is of a grid structure, the first auxiliary portion is coupled to the cathode layer in the display area.

3. The display substrate according to claim 2, wherein the display substrate further comprises a bridging layer, and the bridging layer is arranged at different layers from each of the cathode auxiliary layer and the power line layer;
the first auxiliary portion is coupled to the first power line pattern through the bridging layer.

4. The display substrate according to claim 2, wherein the cathode auxiliary layer further includes a second auxiliary portion located in the peripheral area, and the second auxiliary portion is close to the first side of the display area, the second auxiliary portion is coupled to the first power line pattern.

5. The display substrate according to claim 4, wherein the display substrate further comprises:
a connection layer, wherein the connection layer is located between the cathode auxiliary layer and the cathode layer, and the connection layer includes a plurality of first connection patterns located in the display area, the first auxiliary portion is coupled to the cathode layer through the plurality of first connection patterns in the display area.

6. The display substrate according to claim 5, wherein the display substrate further comprises: a plurality of pixel units arranged in an array, the pixel unit includes an anode pattern group, and an orthographic projection of the first connection pattern on a substrate of the display substrate is located at a periphery of an orthographic projection of the anode pattern group on the substrate.

7. The display substrate according to claim 5, wherein the connection layer further comprises:
a second connection pattern located in the peripheral area, wherein the second connection pattern is close to the first side of the display area, the second auxiliary portion is coupled to the cathode layer through the second connection pattern.

8. The display substrate according to claim 7, wherein,
the power line layer further includes a second power line pattern, the second power line pattern is close to a second side of the display area, the first side and the second side are opposite;
the first auxiliary portion is coupled to the second power line pattern through the bridging layer;
the cathode auxiliary layer further includes a third auxiliary portion located in the peripheral area, the third auxiliary portion is close to the second side of the display area; the third auxiliary portion is coupled to the second power line pattern.

9. The display substrate according to claim 8, wherein the connection layer further comprises:
a third connection pattern located in the peripheral area, wherein the third connection pattern is close to the second side of the display area, and the third auxiliary portion is coupled to the cathode layer through the third connection pattern.

10. The display substrate according to claim 9, wherein each of the second connection pattern and the third connection pattern includes a plurality of first connection sub-patterns and a plurality of second connection sub-patterns; the plurality of first connection sub-patterns are arranged in an array, and adjacent first connection sub-patterns are coupled to each other through the second connection sub-pattern.

11. The display substrate according to claim 10, wherein each of the second auxiliary portion and the third auxiliary portion includes a plurality of first auxiliary sub-patterns and a plurality of second auxiliary sub-patterns, the plurality of first auxiliary sub-patterns are arranged in an array, and adjacent first auxiliary sub-patterns are coupled to each other through the second auxiliary sub-pattern.

12. The display substrate according to claim 11, wherein, the first power line pattern includes a first sub-pattern and two second sub-patterns; the first sub-pattern is located between the two second sub-patterns and the display area, the first sub-pattern includes a portion extending along the first direction, the second sub-pattern includes a portion extending along the second direction, and the first direction intersects the second direction; the first sub-pattern is coupled to the second auxiliary portion; the two second sub-patterns are coupled to two ends of the first sub-pattern respectively, and the two second sub-patterns are also respectively coupled to the driver chip;
each of the first sub-pattern and the second power line pattern includes: a plurality of first power sub-patterns and a plurality of second power sub-patterns, and the plurality of first power sub-patterns are arranged in an array, adjacent first power sub-patterns are coupled to each other through the second power sub-pattern.

13. The display substrate according to claim 12, wherein,
an orthographic projection of at least part of the first connection sub-pattern on the substrate of the display substrate coincides with an orthographic projection of at least part of the first auxiliary sub-pattern on the substrate, and coincides with an orthographic projection of at least part of the first power sub-pattern on the substrate; and/or,
an orthographic projection of at least part of the second connection sub-pattern on the substrate coincides with an orthographic projection of at least part of the second auxiliary sub-pattern on the substrate, and coincides with an orthographic projection of at least part of the second power sub-pattern on the substrate.

14. The display substrate according to claim 5, wherein the display substrate further includes a first source-drain metal layer, a second source-drain metal layer, and an anode layer that are sequentially stacked along a direction away from the substrate of the display substrate;
the power line layer and the first source-drain metal layer are arranged at the same layer and made of the same material, the cathode auxiliary layer and the second source-drain metal layer are arranged at the same layer and made of the same material, and the connection layer and the anode layer are arranged at the same layer and made of the same material.

15. The display substrate according to claim 1, wherein the display area includes a first display region and a second display region;
the cathode layer includes a first cathode portion and a second cathode portion, the first cathode portion extends from the first display region to the peripheral area, and the second cathode portion is located in the second display region; the second cathode portion includes a plurality of third cathode patterns;
the display substrate further includes a plurality of laser blocking patterns, an orthographic projection of the plurality of laser blocking patterns on the substrate of the display substrate coincides with an orthographic projection of the plurality of third cathode patterns on the substrate.

16. The display substrate according to claim 15, wherein the display substrate further includes a driving transistor in the first display region; the laser blocking pattern and an active layer of the driving transistor are arranged at the same layer and made of the same material.

17. The display substrate according to claim 15, wherein the display substrate further includes a transparent conductive connection layer, and the transparent conductive connection layer is respectively coupled to the plurality of third cathode patterns.

18. The display substrate according to claim 17, wherein the transparent conductive connection layer extends from the second display region to the peripheral area, and the transparent conductive connection layer is coupled to the second power line pattern included in the power line layer, or
wherein the transparent conductive connection layer is of a grid structure;
or
wherein the cathode auxiliary layer includes a fourth auxiliary portion, the fourth auxiliary portion is located in the second display region, and the fourth auxiliary portion includes a plurality of third auxiliary sub-patterns, the plurality of third auxiliary sub-patterns are located between the transparent conductive connection layer and the third cathode pattern, the transparent conductive connection layer is coupled to a corresponding third cathode pattern through a corresponding third auxiliary sub-pattern, wherein a notch is located on a side surface of the third auxiliary sub-pattern; the display substrate further includes an anode layer, a light-emitting functional layer and a common layer; the light-emitting functional layer and the common layer are located between the anode layer and the cathode layer, and the light-emitting functional layer and the common layer are stacked;
the common layer is disconnected at the notch of the third auxiliary sub-pattern.

19. The display substrate according to claim 1, wherein the display substrate further comprises:
a first initialization signal line located in the peripheral area, the first initialization signal line being close to the first side of the display area;
a second initialization signal line located in the peripheral area, the second initialization signal line being close to the second side of the display area, and the second side being opposite to the first side;
an initialization signal layer extending from the display area to the peripheral area, the initialization signal layer being respectively coupled to the first initialization signal line and the second initialization signal line.

* * * * *